United States Patent
Tang et al.

(10) Patent No.: US 9,954,075 B2
(45) Date of Patent: Apr. 24, 2018

(54) THYRISTOR RANDOM ACCESS MEMORY DEVICE AND METHOD

(71) Applicant: Micron Technology, Inc., Boise, ID (US)

(72) Inventors: Sanh D. Tang, Boise, ID (US); John K. Zahurak, Eagle, ID (US); Michael P. Violette, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 4 days.

(21) Appl. No.: 15/284,017

(22) Filed: Oct. 3, 2016

(65) Prior Publication Data

US 2017/0025517 A1    Jan. 26, 2017

Related U.S. Application Data

(62) Division of application No. 14/028,242, filed on Sep. 16, 2013, now Pat. No. 9,461,155, which is a division of application No. 12/826,323, filed on Jun. 29, 2010, now Pat. No. 8,535,992.

(51) Int. Cl.
| | |
|---|---|
| *H01L 21/332* | (2006.01) |
| *H01L 29/66* | (2006.01) |
| *H01L 27/102* | (2006.01) |
| *H01L 29/423* | (2006.01) |
| *H01L 29/74* | (2006.01) |

(52) U.S. Cl.
CPC .... *H01L 29/66363* (2013.01); *H01L 27/1027* (2013.01); *H01L 29/42308* (2013.01); *H01L 29/74* (2013.01); *H01L 2924/1301* (2013.01)

(58) Field of Classification Search
CPC ..... H01L 2924/1301; H01L 2924/1305; H01L 2924/13062
See application file for complete search history.

(56) References Cited

U.S. PATENT DOCUMENTS

| | | | |
|---|---|---|---|
| 5,731,609 A | 3/1998 | Hamamoto et al. | |
| 5,998,833 A | 12/1999 | Baliga et al. | |
| 6,072,209 A | 6/2000 | Noble et al. | |
| 6,103,579 A * | 8/2000 | Violette | H01L 21/76202 257/E21.552 |

(Continued)

FOREIGN PATENT DOCUMENTS

| | | |
|---|---|---|
| CN | 101300665 A | 11/2008 |
| CN | 103026489 B | 11/2014 |

(Continued)

OTHER PUBLICATIONS

"Chinese Application Serial No. 20140503567.0, Response filed Mar. 6, 2017 to Office Action dated Oct. 20, 2016", W/English Claims, 15 pgs.

(Continued)

*Primary Examiner* — Zandra Smith
*Assistant Examiner* — John M Parker
(74) *Attorney, Agent, or Firm* — Schwegman Lundberg & Woessner, P.A.

(57) ABSTRACT

Memory devices and methods of making memory devices are shown. Methods and configurations as shown provide folded and vertical memory devices for increased memory density. Methods provided reduce a need for manufacturing methods such as deep dopant implants.

18 Claims, 11 Drawing Sheets

(56) References Cited

U.S. PATENT DOCUMENTS

| | | | |
|---|---|---|---|
| 6,225,165 | B1 | 5/2001 | Noble, Jr. et al. |
| 6,316,309 | B1 | 11/2001 | Holmes et al. |
| 6,653,174 | B1 | 11/2003 | Cho et al. |
| 6,683,330 | B1 | 1/2004 | Horch et al. |
| 6,727,528 | B1 | 4/2004 | Robins et al. |
| 6,781,191 | B2 | 8/2004 | Lin |
| 7,199,417 | B2 | 4/2007 | Forbes |
| 7,220,634 | B2 | 5/2007 | Prall et al. |
| 7,259,415 | B1 | 8/2007 | Forbes |
| 7,374,974 | B1 | 5/2008 | Horch et al. |
| 7,456,439 | B1 | 11/2008 | Horch |
| 7,655,973 | B2 | 2/2010 | Mauli |
| 7,659,560 | B2 | 2/2010 | Tang et al. |
| 8,535,992 | B2 | 9/2013 | Tang et al. |
| 9,461,155 | B2 | 10/2016 | Tang et al. |
| 2001/0002062 | A1 | 5/2001 | Noble, Jr. et al. |
| 2001/0039091 | A1 | 11/2001 | Nakagawa |
| 2002/0093030 | A1 | 7/2002 | Hsu et al. |
| 2006/0043450 | A1* | 3/2006 | Tang ............... H01L 21/28132 257/302 |
| 2007/0096203 | A1 | 5/2007 | Mouli |
| 2009/0129145 | A1 | 5/2009 | Slesazeck |
| 2009/0179262 | A1 | 7/2009 | Holz et al. |
| 2009/0302380 | A1 | 12/2009 | Graf et al. |
| 2011/0316042 | A1 | 12/2011 | Tang et al. |
| 2014/0015001 | A1 | 1/2014 | Tang et al. |

FOREIGN PATENT DOCUMENTS

| | | |
|---|---|---|
| CN | 104362150 A | 2/2015 |
| KR | 102008006674 A | 7/2008 |
| SG | 10201508076 | 10/2015 |
| TW | 201212165 A | 3/2012 |
| WO | WO-2012006094 A2 | 1/2012 |
| WO | WO-2012006094 A3 | 1/2012 |

OTHER PUBLICATIONS

"Chinese Application Serial No. 201410503567.0, Office Action dated Oct. 20, 2016", W/English Translation, 12 pgs.

"Korean Application Serial No. 10-2013-7002248, Office Action dated Mar. 28, 2017", w/ English Translation, 8 pgs.

"Korean Application Serial No. 10-2013-7002248, Office Action dated Nov. 3, 2016", with English Translation, 12 pgs.

"Korean Application Serial No. 10-2013-7002248, Response filed Jan. 3, 2017 to Office Action dated Nov. 3, 2016", W/ English Translation of Claims, 17 pgs.

"Korean Application Serial No. 10-2013-7002248, Response filed May 29, 2017 to Office Action dated Mar. 28, 2017", W/English Claims, 19 pgs.

"Chinese Application Serial No. 201180036064.1, Office Action dated Jan. 13, 2014", w/English translation, 13 pgs.

"Chinese Application Serial No. 201180036064.1, Response filed May 27, 2014 to Office Action dated Jan. 13, 2014", w/English claims, 8 pgs.

"Chinese Application Serial No. 201180036064.1, Voluntary Amendment filed Oct. 25, 2013", w/English claims, 12 pgs.

"International Application Serial No. PCT/US2011/042196, International Preliminary Report on Patentability dated Jan. 17, 2013", 6 pgs.

"International Serial Application No. PCT/US2011/042196, International Search Report dated Feb. 27, 2012", 3 pgs.

"International Serial Application No. PCT/US2011/042196, Written Opinion dated Feb. 27, 2012", 4 pgs.

\* cited by examiner

THYRISTOR RANDOM ACCESS MEMORY DEVICE AND METHOD

PRIORITY APPLICATION

This application is a divisional of U.S. application Ser. No. 14/028,242, filed Sep. 16, 2013, which is a divisional of U.S. application Ser. No. 12/826,323, filed Jun. 29, 2010, now issued as U.S. Pat. No. 8,535,992, all of which are incorporated herein by reference in their entirety.

BACKGROUND

Thyristor random access memory (TRAM) provides a memory structure that does not need storage capacitors to store a memory state. However device configurations to date use a considerable amount of surface area. Improvements in device configuration are needed to further improve memory density. Further, it is desirable to form devices using manufacturing methods that are reliable and efficient.

DETAILED DESCRIPTION

In the following detailed description of the invention, reference is made to the accompanying drawings that form a part hereof and in which are shown, by way of illustration, specific embodiments in which the invention may be practiced. These embodiments are described in sufficient detail to enable those skilled in the art to practice the invention. Other embodiments may be utilized and chemical, structural, logical, electrical changes, etc. may be made.

The terms wafer and substrate used in the following description include any structure having an exposed surface with which to form a device or integrated circuit (IC) structure. The term substrate is understood to include semiconductor wafers. The term substrate is also used to refer to semiconductor structures during processing, and may include other layers, such as silicon-on-insulator (SOI), etc. that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

It is desirable to provide memory cells that are scalable to increasing demand for high memory density. It is also desirable that such methods are efficient in production, and low in cost.

Figure 1:
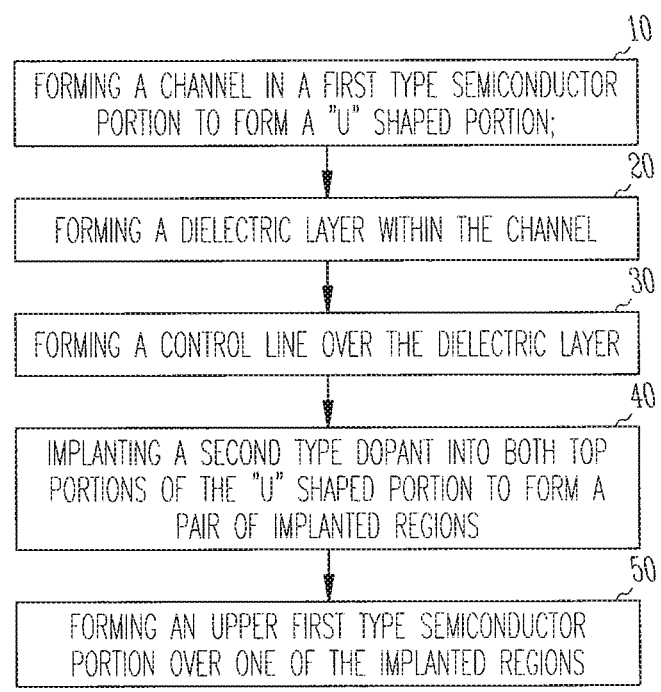
FIG. 1 shows a flow diagram of an example method according to an embodiment of the invention.

FIG. 1 shows an example method of forming a memory cell according to an embodiment of the invention. Specific cell configurations formed using this and other methods are shown in subsequent figures and described in more detail below. In operation 10, a channel is formed in a first type semiconductor portion to form a "U" shaped portion. In operation 20, a dielectric material is formed within the channel, and in operation 30, a control line is formed over the dielectric material. In operation 30, a second type semiconductor is implanted into top portions of the "U" shaped portion to form a pair of implanted regions. Operation 50 recites forming an upper first type semiconductor portion over one of the implanted regions.

Implanting in accordance with embodiments of the invention does not require deep implants. The deeper an implant operation goes into a substrate, the more chance there is for damage to the crystalline semiconductor lattice. As a result, deeper implant regions may not operate as efficiently as shallow implant regions with less lattice damage. Shallow implants are also typically easier to produce.

In one example, the first type dopant is P and the second type dopant is N. Other configurations include the first type dopant as N type, and the second type dopant is P type. In one example, the first type semiconductor portion formed into the "U" shaped portion is a P-type semiconductor. In one example the P-type semiconductor is a top portion of a silicon-on-insulator substrate. In one example the first type semiconductor portion is a native doped portion. When using a native P-doped portion of a substrate, an undamaged crystalline lattice is available, which can provide better performance than an implanted semiconductor portion. Methods described in the present disclosure are used to form devices without deep implant steps. These devices are easier to form, and are more reliable due to a lower amount of lattice damage from deep dopant implants.

Figure 2A:
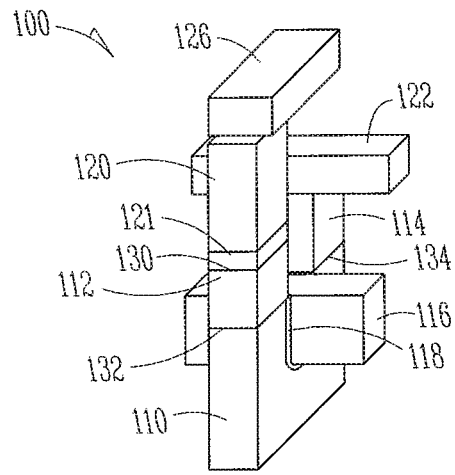
FIG. 2A shows a semiconductor memory device according to an embodiment of the invention.

FIG. 2A shows an example memory device 100 according to an embodiment of the invention. The device 100 includes a thyristor memory device. Thyristor devices have small physical size compared to other memory devices. Embodiments of thyristor devices described herein do not require a storage capacitor to store a memory state, which allows for extremely small individual memory cell dimensions. This allows higher memory density in memory arrays.

The thyristor configuration in FIG. 2A includes a first P-N junction 130, a second P-N junction 132, and a third P-N junction 134 that are coupled in series. A control line 116 is shown between two of the P-N junctions. In operation, when activated by the control line 116, a signal travels from a first transmission line 122, through the series of P-N junctions, and out to a second transmission line 126.

In one example, a channel is formed in a P-type semiconductor portion to form a "U" shaped semiconductor portion 110. An N-type dopant is implanted into an exposed surface of the top portions of the "U" shaped portion 110 to form first N-region 112 and second N-region 114. In one example the first N-region 112 is lightly doped, and the second N-region 114 is heavily doped (N+). Because the first N-region 112 and the second N-region 114 are both formed on a surface of the P-type semiconductor portion 110, before subsequent depositions processes, no deep implant operations are necessary.

A dielectric material 118 is shown separating the control line 116 from the "U" shaped P-type semiconductor portion 110. By placing the control line 116 within the channel of the "U" shaped P-type semiconductor portion 110 a large surface area is adjacent to the control line 116. This provides increased control over activation of the "U" shaped P-type semiconductor portion 110 in contrast to configurations where a control line is only adjacent to one side surface of a semiconductor region.

An upper first type semiconductor portion 121 is then formed over the first N-region 112. In the example shown, the upper first type semiconductor portion 121 includes a lightly doped P-type region that is implanted in the first N-region 112. This method of manufacture allows the upper first type semiconductor portion 121 to be surface implanted, and damage to the lattice is reduced in contrast to deep implants.

In one example, a heavily doped P+ portion 120 is formed over the upper first type semiconductor portion 121. In one example, the heavily doped P+ portion 120 includes a physical deposition of P+ polysilicon. A first transmission line 122 is shown formed over the second N-region 114 and a second transmission line 126 is shown formed over the heavily doped P+ portion 120. In one example, the first transmission line 122 and the second transmission line 126 are substantially orthogonal to one another, and form a row and column memory layout as shown in more detail in subsequent examples.

Figure 2B:
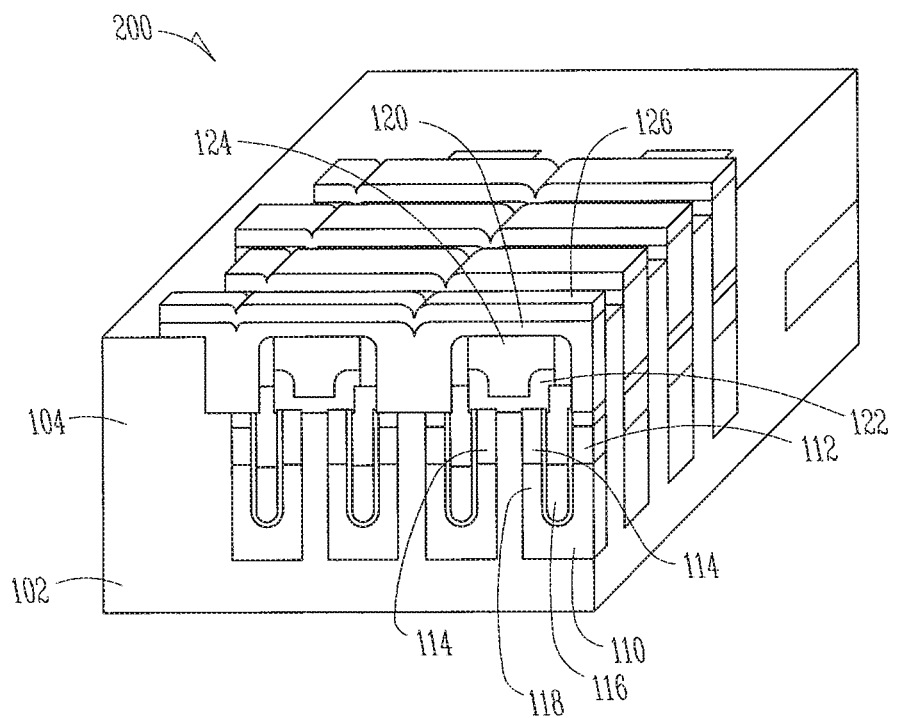
FIG. 2B shows a number of semiconductor memory devices according to an embodiment of the invention.

FIG. 2B shows multiple memory devices 100 from FIG. 2A in a portion of a memory array 200. FIG. 2B shows a base oxide material 102 that is part of a substrate. In the example of FIG. 2B, a semiconductor material of an SOI substrate is patterned and etched, leaving behind semiconductor material used to form the U" shaped P-type semiconductor portion 110 and the first N-region 112 and the second N-region 114. A dielectric portion 104 is shown formed around the semiconductor structures formed from the SOI substrate.

In the example of FIG. 2B, the first transmission line 122 includes a metal conductor 123 that is electrically isolated using a nitride cap 124. FIG. 2B also illustrates the heavily doped P+ portion 120 configured as a continuous structure that contacts the second transmission line 126 along a length of the transmission line 126. In one example the continuity of heavily doped P+ portion 120 helps to provide a conduction path for the second transmission line 126 and improves performance of the memory array 200. In one example the second transmission line 126 is formed from a metal, or conductive metallic compound, and serves as a metal cap over the heavily doped P+ portion 120 to enhance conduction in the second transmission line 126.

In the example memory array 200, adjacent memory devices 100 share a common first transmission line 122. Example configurations of the memory array 200 are further shown in FIGS. 3A-3C.

Figure 3A:
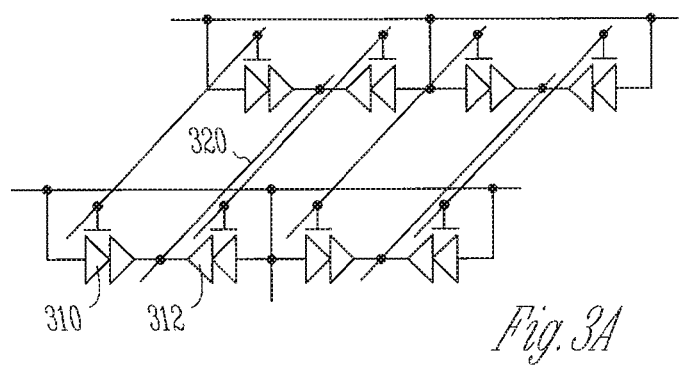
FIG. 3A shows schematic configuration of memory devices according to an embodiment of the invention.
Figure 3B:
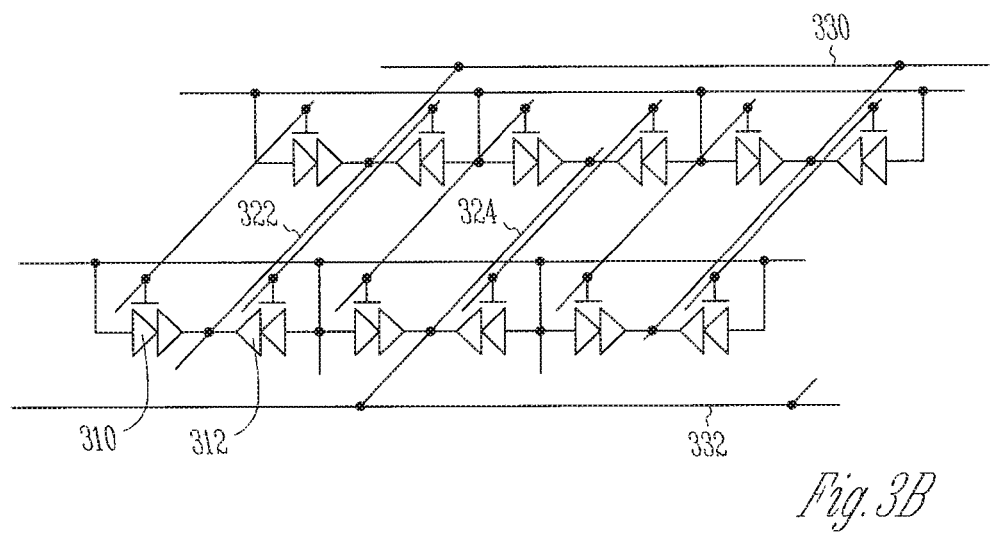
FIG. 3B shows another schematic configuration of memory devices according to an embodiment of the invention.

FIG. 3A shows a schematic diagram of a memory array similar to the array 200 from FIG. 2B. FIG. 3A shows a first memory device 310 and a second adjacent memory device 312 sharing a common transmission line 320. Similarly, FIG. 3B shows a first memory device 310 and a second adjacent memory device 312 sharing a common transmission line 322. In FIG. 3B, the common transmission line 322 is routed to one side of the array to sensing circuitry 330. A second common transmission line 324 is shown routed to an opposite side of the array to sensing circuitry 332. The configuration of FIG. 3B is shown alternating common transmission lines between opposite sides of the array. This configuration provides more room for circuitry on sides of the array because each side need only interface with half of the memory cells in the array.

Figure 3C:
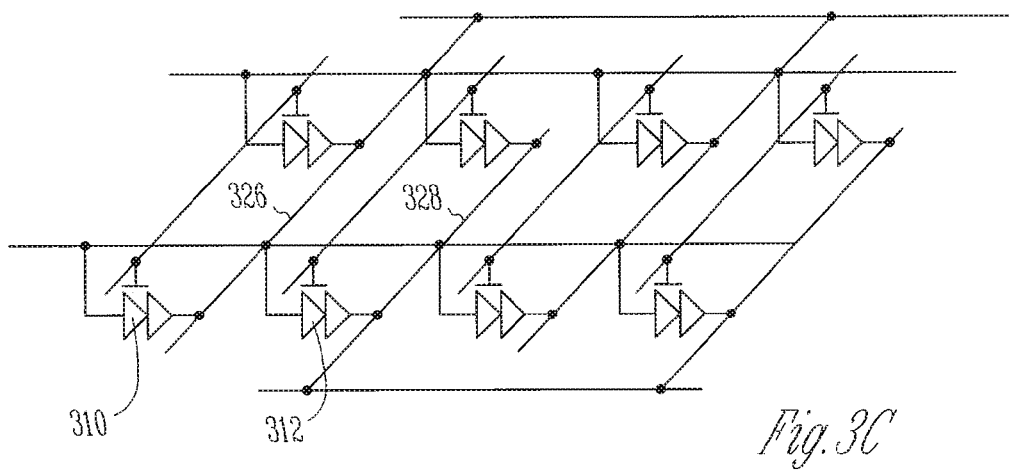
FIG. 3C shows another schematic configuration of memory devices according to an embodiment of the invention.

FIG. 3C shows an alternating arrangement of transmission lines 326 and 328, that is similar to the alternating arrangement of FIG. 3B. However in FIG. 3C, transmission lines 326 and 328 are not shared between adjacent memory cells 310 and 312.

Figure 4:
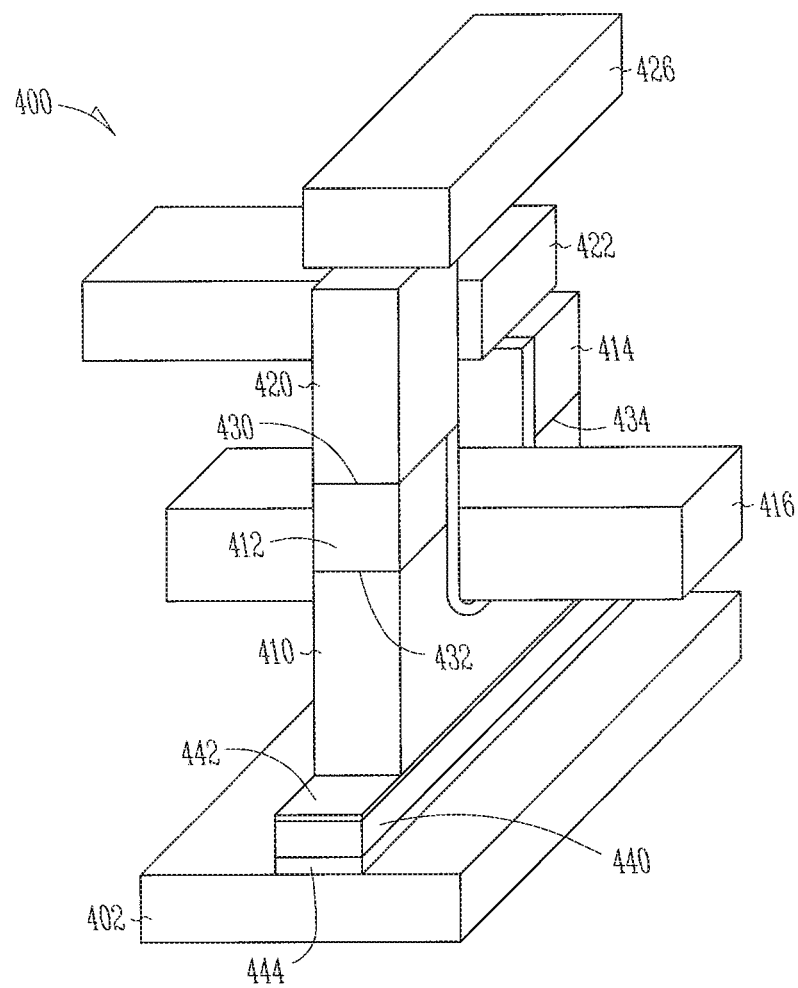
FIG. 4 shows a semiconductor memory device according to an embodiment of the invention.

FIG. 4 shows a memory device 400 according to an embodiment of the invention. Similar to the memory device 100 of FIG. 2A, the memory device 400 includes a thyristor device with a first P-N junction 430, a second P-N junction 432, and a third P-N junction 434 that are coupled in series. A control line 416 is shown between two of the P-N junctions with a dielectric material separating the control line 416 from the adjacent semiconductor body.

In FIG. 4, a channel is formed in a P-type semiconductor portion to form a "U" shaped semiconductor portion 410. An N-type dopant is implanted into an exposed surface of the top portions of the "U" shaped portion to form first N-region 412 and second N-region 414. In one example the first N-region 412 is lightly doped, and the second N-region 414 is heavily doped (N+). Because the first N-region 412 and the second N-region 414 are both formed on a surface of the P-type semiconductor portion 410, no deep implant operations are necessary.

Similar to memory device 100, by placing the control line 416 within the channel of the "U" shaped P-type semiconductor portion 410 a large surface area is adjacent to the control line 416. This provides increased control over activation of the "U" shaped P-type semiconductor portion 410 in contrast to configurations where a control line is only adjacent to one side surface of a semiconductor region.

An upper first type semiconductor portion 420 is then formed over the first N-region 412. In one example the heavily doped P+ portion 420 includes a physical deposition of P+ polysilicon. A first transmission line 422 is shown formed over the second N-region 414 and a second transmission line 426 is shown formed over the heavily doped P+ portion 420. In one example, the first transmission line 422 and the second transmission line 426 are substantially orthogonal to one another, and form a row and column memory layout.

FIG. 4 further illustrates a back gate 440 formed from a conductor region. Examples of conductor regions include metal regions such as titanium or tungsten, or alloys thereof. The back gate 440 is separated from the "U" shaped P-type semiconductor portion 410 by a dielectric material 442. The example memory device 400 of FIG. 4 operates as a hybrid between a thyristor memory cell, and a floating body cell. In operation, the back gate 440 is used to facilitate charge storage beneath the memory device 400.

In one embodiment, an amorphous silicon material 444 is further included between the back gate 440 and a base oxide material 402 of the substrate. Inclusion of the amorphous silicon material 444 is included in selected embodiments, and is useful in fabrication of the memory device 400.

Figure 5A:
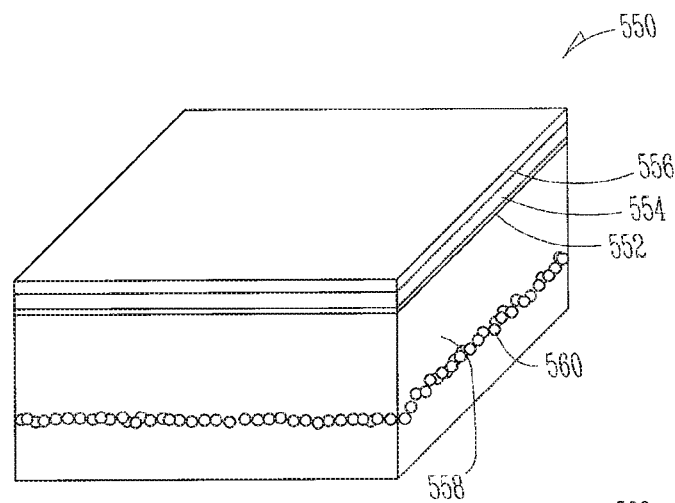
FIG. 5A shows a manufacturing stage in forming a memory device according to an embodiment of the invention.
Figure 5B:
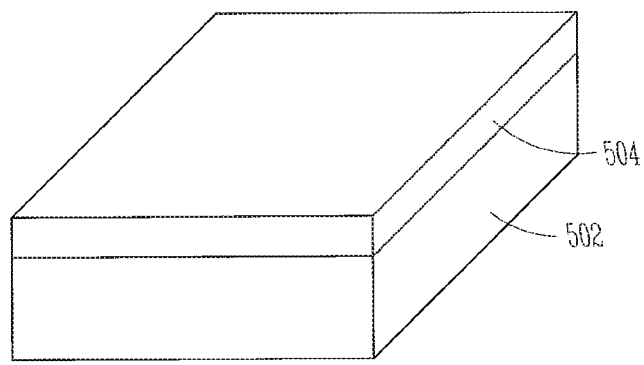
FIG. 5B shows another manufacturing stage in forming a memory device according to an embodiment of the invention.
Figure 5C:
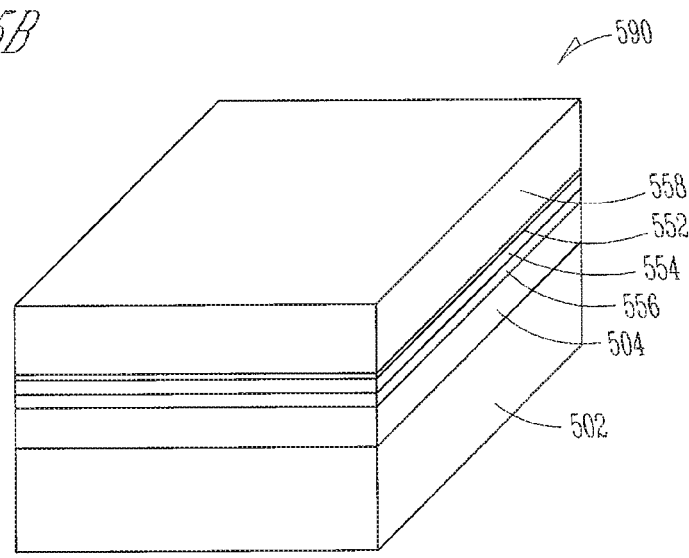
FIG. 5C shows another manufacturing stage in forming a memory device according to an embodiment of the invention.

FIGS. 5A-5C show steps in fabrication of a material stack 590 used to make memory device 400 from FIG. 4. In FIG. 5A a dielectric material 552 is formed over a first bulk semiconductor 558. In one example the first bulk semiconductor 558 includes bulk P-type doped silicon. A conductor region 554 is then formed over the dielectric material 552. A bonding material 556 is then formed over the conductor region 554 to form a first layered substrate 550. In one example, the bonding material 556 includes an amorphous silicon material, however the invention is not so limited. Other semiconductor layers, or non amorphous layers can also be used to bond depending on the choice of second substrate as discussed below.

FIG. 5B shows a second substrate 500. In one example, the second substrate 500 includes a bulk silicon substrate 502 with a dielectric material 504. In one example, the dielectric material 504 includes silicon oxide that is formed by oxidizing the bulk silicon 502. One of ordinary skill in the art, having the benefit of the present disclosure, will recognize that other dielectric configurations and substrates are also possible.

FIG. 5C shows the first layered substrate 550 from FIG. 5A flipped over and the bonding material 556 is bonded to the dielectric material 504 of the second substrate 500. In one example a marker material 560, as illustrated in FIG. 5A, is used in configuring the bulk P-type doped silicon 558 to the configuration shown in FIG. 5C. In one example, a hydrogen implant is placed as the marker material 560 at a desired depth in the bulk P-type doped silicon 558 to define a thickness for subsequent memory device fabrication. After the first layered substrate 550 is flipped and bonded to the second substrate 500, the backside bulk P-type doped silicon 558 is thinned until the marker material 560 is detected. Although a hydrogen implant marker is described as an example, one of ordinary skill in the art, having the benefit of the present disclosure, will recognize that other techniques of separating the dielectric material 552 and conductor region 554 from the bulk P-type doped silicon 558 are within the scope of the invention. For example, other techniques may not use marker materials. Other examples of separating the dielectric material 552 and conductor region 554 from the bulk P-type doped silicon 558 may include cutting, without a thinning process.

Once the material stack 590 is formed, the bulk P-type doped silicon 558 can be processed as described above to form memory devices such as memory device 400 from FIG. 4. Processing two substrates separately and bonding them as described in FIG. 5A-5C simplifies formation of buried structures such as the back gate 440 from FIG. 4. Other methods of processing on a single substrate may involve more complicated operations such as deep trench deposition or implantation. Methods as shown in FIG. 5A-5C simplify device fabrication and provide more reliable buried structures such as the back gate 440 and dielectric material 552.

Figure 6:
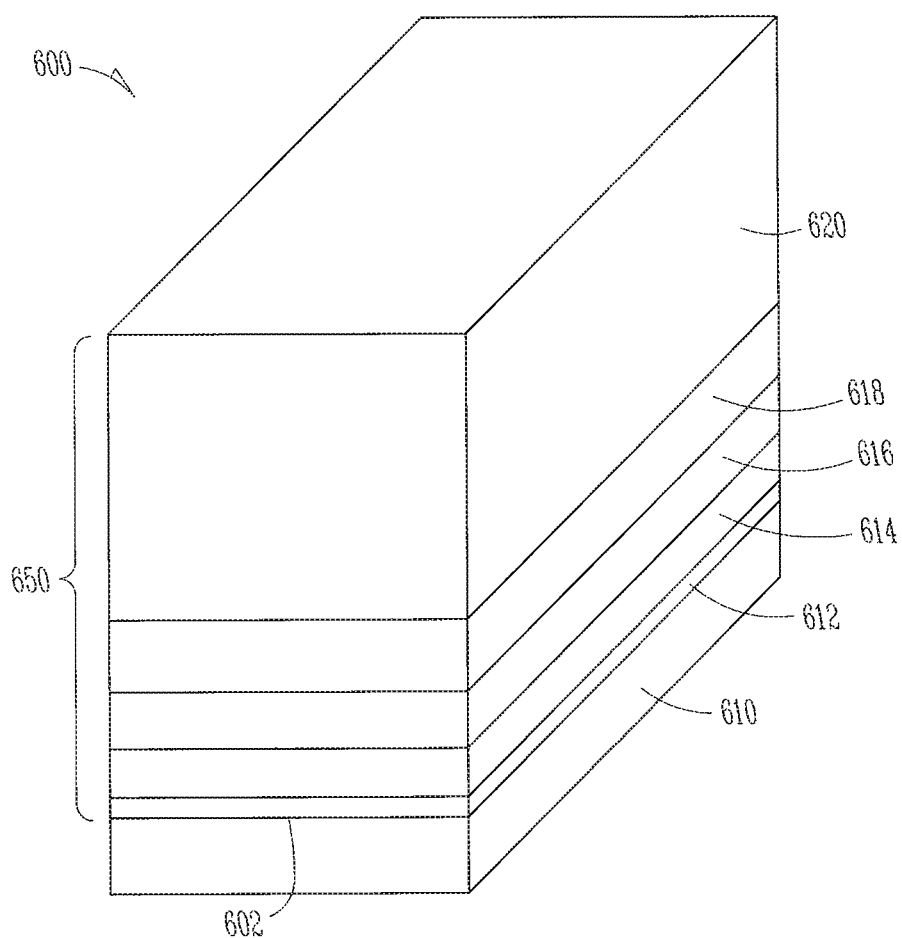
FIG. 6 shows a manufacturing stage in forming a memory device according to an embodiment of the invention.

FIG. 6 describes a material stack 600 used for forming memory devices according to embodiments of the invention. In one example, the material stack 600 is formed from two substrates that are bonded, similar to embodiments described in FIG. 5A-5C. In one example a first substrate 650, including a P-type bulk semiconductor 620 is implanted to form an N-type region 618. A P+ region 616 is then formed over the N-type region 618. In one example the P+ region 616 is physically deposited over the implanted N-type region 618. In other embodiments, the P+ region 616 is further implanted into the implanted N-type region 618. A conductor region 614 is then deposited over the P+ region 616, and a bonding material 612 is formed over the conductor region 614. The first substrate 650 is then bonded to a second substrate 610 at interface 602. In one example, the second substrate 610 includes a silicon oxide material over a bulk silicon substrate, although the invention is not so limited. The material stack 600 can then be used to fabricate memory devices such as those described below.

Figure 7:
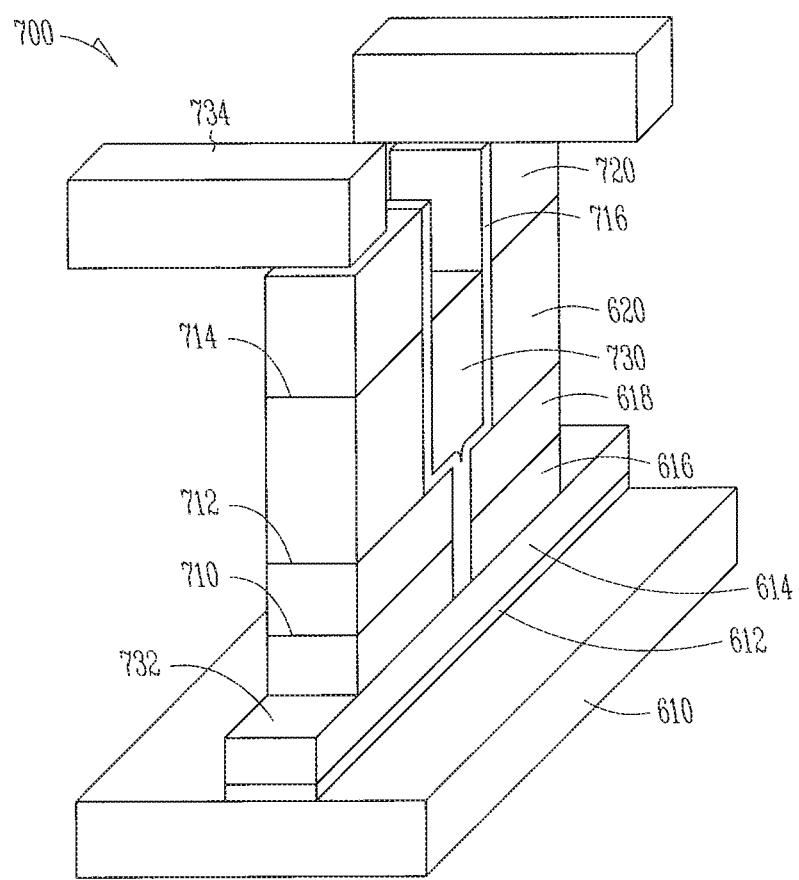
FIG. 7 shows an example control line configuration of a semiconductor memory device according to an embodiment of the invention.

FIG. 7 describes a memory device 700 according to an embodiment of the invention, formed from the material stack 600 from FIG. 6. A first P-N junction 710, a second P-N junction 712, and a third P-N junction 714 are shown coupled in series. The first P-N junction 710, the second P-N junction 712, and the third P-N junction 714 of FIG. 7 are vertically coupled, in contrast to the coupling shown in memory device 100 of FIG. 1, which uses a "U" shaped portion to fold the memory device 100. Vertical coupling the three P-N junctions, as in FIG. 7, provides a reduced areal footprint, thus enabling higher memory array density.

In the memory device 700, the first P-N junction 710 and the second P-N junction 712 are formed from the material stack 600. In one example the third P-N junction 714 is formed by implanting region 720 over the material stack 600. Although implanting is used to form region 720, alternative embodiments can use physical material deposition or other suitable methods.

A control line 730 is shown formed laterally between adjacent memory devices, and vertically between two of the vertically coupled P-N junctions. A dielectric material 716 separates the control line 730 from the vertical stack of alternating semiconductor material in the memory device 700. A buried transmission line 732 is shown, formed from the conductor region 614 of the material stack 600. Buried transmission line 732 provides space savings in a memory array and increased memory density. A second transmission line 734 is shown coupled to a top of the region 720. In operation, the control line 730 activates the memory device 700, and a signal is detected flowing from one transmission line, vertically through the device 700 and into the other transmission line.

Figure 8:
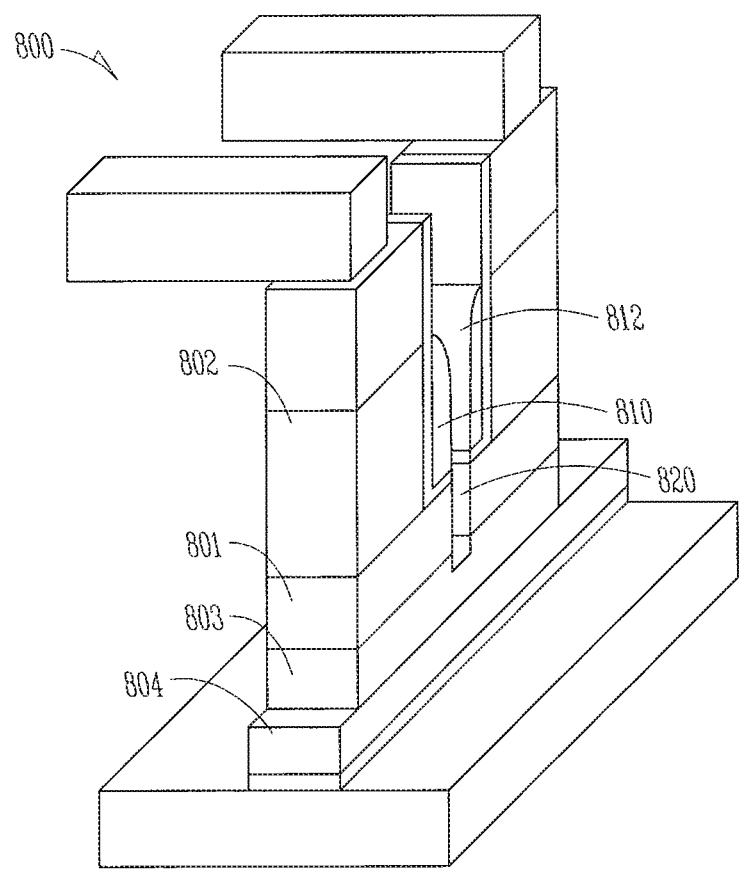
FIG. 8 shows another example configuration of a semiconductor memory device according to an embodiment of the invention.

FIG. 8 shows a memory device 800 according to an embodiment of the invention. In one embodiment, the memory device 800 is formed from a material stack, such as the material stack 600 from FIG. 6. The memory device 800 includes a pair of control lines 810 and 812 formed in a trench between adjacent memory devices. An isolation trench 820 is shown separating the pair of control lines 810 and 812. In the example of FIG. 8, the isolation trench 820 separates N-regions 801 between vertical pillars 802 of alternating conductivity type semiconductor material. A heavily doped (P+) region 803 is left at least partially continuous along a line parallel with a buried transmission line 804. In one embodiment, the heavily doped (P+) region 803 aids in conduction along the buried transmission line 804.

Figure 9:
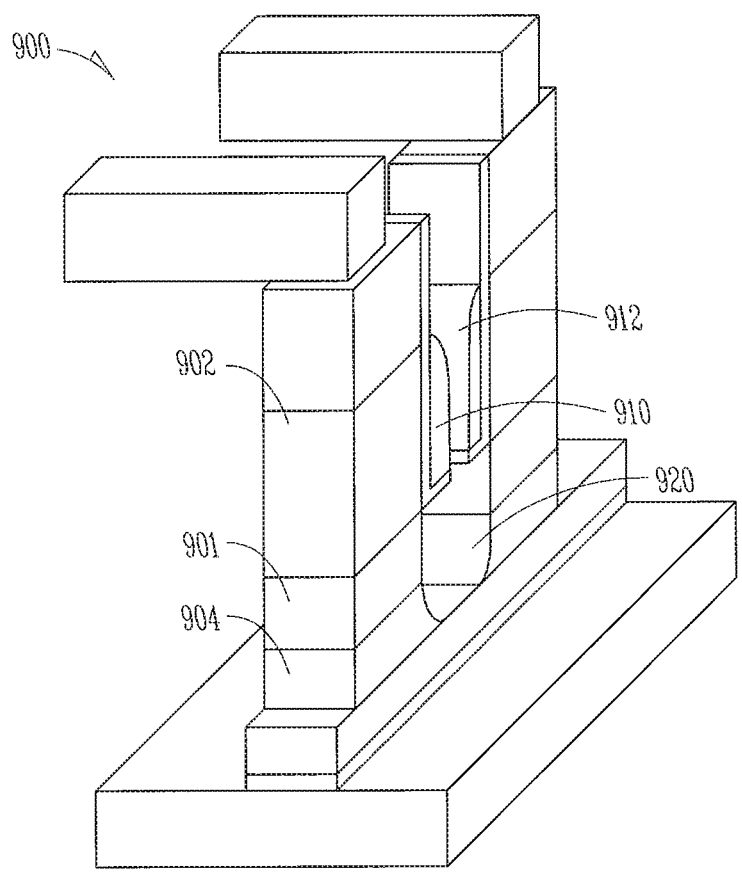
FIG. 9 shows another example configuration of a semiconductor memory device according to an embodiment of the invention.

FIG. 9 shows a memory device 900 according to an embodiment of the invention. Similar to memory device 800 of FIG. 8, the memory device 900 includes a pair of control lines 910 and 912 formed in a trench between adjacent memory devices. An isolation region 920 is shown separating vertical pillars 902 of alternating conductivity type semiconductor material. The configuration of FIG. 9 completely separates adjacent N-regions 901 and heavily doped (P+) regions 904.

Figure 10:
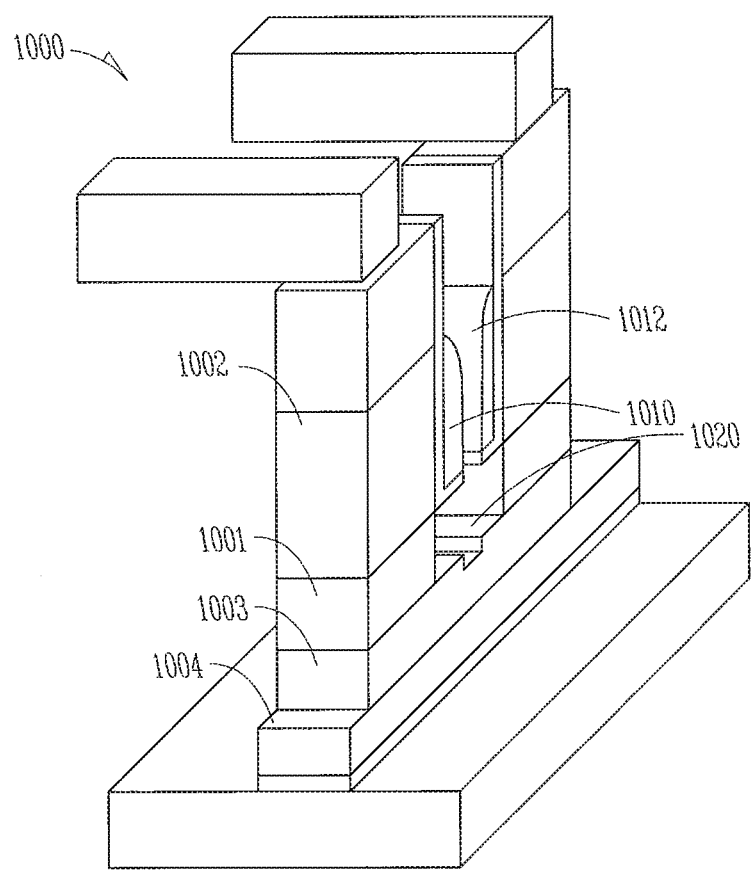
FIG. 10 shows another example configuration of a semiconductor memory device according to an embodiment of the invention.

FIG. 10 shows a memory device 1000 according to an embodiment of the invention. Similar to memory devices described above, the memory device 1000 includes a pair of control lines 1010 and 1012 formed in a trench between adjacent memory devices. An isolation region 1020 is shown separating vertical pillars 1002 of alternating conductivity type semiconductor material. A heavily doped (P+) region 1003 is left at least partially continuous along a line parallel with a buried transmission line 1004. In one embodiment, the heavily doped (P+) region 1003 aids in conduction along the buried transmission line 1004. In contrast to memory device 800 of FIG. 8, the isolation region 1020 of FIG. 10 etches back N-region 1001 to further isolate the vertical pillars 1002, and remove portions of the N-region 1001 adjacent to the control lines 1010 and 1012.

Figure 11:
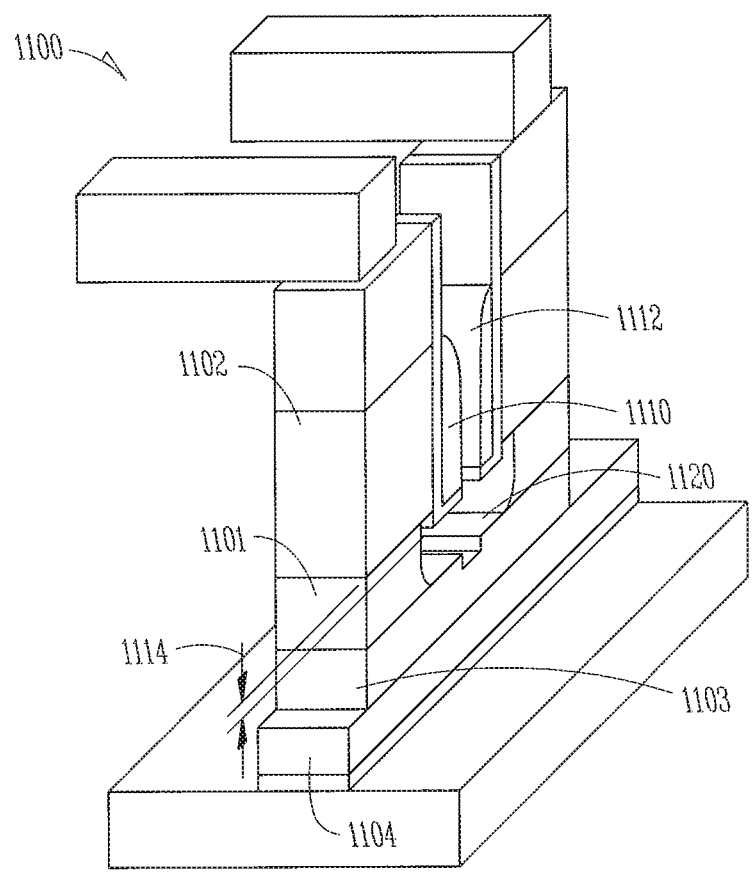
FIG. 11 shows another example configuration of a semiconductor memory device according to an embodiment of the invention.

FIG. 11 shows a memory device 1100 according to an embodiment of the invention. Similar to memory devices described above, the memory device 1100 includes a pair of control lines 1110 and 1112 formed in a trench between adjacent memory devices. An isolation region 1120 is shown separating vertical pillars of alternating conductivity type semiconductor material 1102. A heavily doped (P+) region 1103 is left at least partially continuous along a line parallel with a buried transmission line 1104. In one embodiment, the heavily doped (P+) region 1103 aids in conduction along the buried transmission line 1104. Similar to memory device 1000 of FIG. 10, the isolation region 1120 of FIG. 11 etches back N-region 1101 to further isolate the vertical pillars 1102, and remove portions of the N-region 1101 adjacent to the control lines 1110 and 1112. In addition, memory device 1100 provides an overlap distance 1114, where the control lines 1110 and 1112 extend downward over a portion of the N-region 1101.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon studying the above description.

What is claimed is:

1. A method comprising:
    forming two vertically coupled P-N junctions on a first substrate;
    forming a conductor region over the two vertically coupled P-N junctions;
    flipping the first substrate, and bonding the conductor region to a dielectric material of a second substrate;
    forming a third vertically coupled P-N junction on a back side of a portion of the first substrate;
    forming a control line between two of the vertically coupled P-N junctions;
    forming a buried transmission line from a portion of the conductor region; and
    forming a second transmission line on top of the third vertically coupled P-N junction.

2. The method of claim 1, wherein forming two vertically coupled P-N junctions on a first substrate includes forming on a P-doped silicon substrate.

3. The method of claim 1, wherein forming a conductor region over the two vertically coupled P-N junctions includes forming a titanium conductor region.

4. The method of claim 1, wherein forming a conductor region over the two vertically coupled P-N junctions includes forming a tungsten conductor region.

5. The method of claim 1, further including forming an amorphous silicon material over the conductor region prior to flipping the first substrate, and bonding the conductor region to the dielectric material of the second substrate.

6. A method comprising:
    forming a vertical stack of alternating conductivity type semiconductor material, including:
        forming two vertically coupled P-N junctions on a first substrate;
        forming a conductor region over the two vertically coupled P-N junctions;
        flipping the first substrate, and bonding the conductor region to a dielectric material of a second substrate;
        forming a third vertically coupled P-N junction on a back side of a portion of the first substrate;
    forming trenches in the vertical stack to form an array of vertical pillars of alternating conductivity type semiconductor material; and
    forming at least one control line in a trench between two adjacent pillars separated from a channel region by a dielectric material.

7. The method of claim 6, wherein forming at least one control line in the trench includes forming a single control line to operate a pair of adjacent channel regions on adjacent pillars in the array at the same time.

8. The method of claim 6, wherein forming at least one control line in the trench includes forming a pair of split control lines in the same trench to operate adjacent channel regions on adjacent pillars in the array separately.

9. The method of claim 6, wherein forming trenches includes forming trenches down to the conductor region.

10. The method of claim 6, further including etching a portion of the vertical stack underneath the at least one control line.

11. The method of claim 6, wherein forming two vertically coupled P-N junctions on a first substrate includes forming two vertically coupled P-N junctions on a P-type silicon substrate.

12. The method of claim 6, wherein bonding the conductor region to the dielectric material of the second substrate includes bonding the conductor region to a silicon oxide material on a silicon substrate.

13. The method of claim 6, further including forming a buried transmission line from a portion of the conductor region.

14. The method of claim 13, further including forming a second transmission line on top of the vertical pillars.

15. A method comprising:
   forming a P-N-P layer structure to form a first substrate;
   forming a conductor region over the first substrate;
   flipping the first substrate, and bonding the conductor region to a dielectric material of a second substrate;
   forming an N layer on a back side of a portion of the first substrate;
   forming a trench at least partially through the N layer and the P-N-P layer; and
   forming a control line within the trench.

16. The method of claim 15, further including forming a buried transmission line from a portion of the conductor region.

17. The method of claim 15, further including forming a second transmission line on top of the N layer.

18. The method of claim 15, wherein bonding the conductor region includes bonding using amorphous silicon.

* * * * *